US009581917B2

(12) United States Patent
Bucci

(10) Patent No.: US 9,581,917 B2
(45) Date of Patent: Feb. 28, 2017

(54) SHADOW MASK TENSIONING METHOD AND APPARATUS

(71) Applicant: ADVANTECH GLOBAL, LTD, Tortola (VG)

(72) Inventor: Brian Arthur Bucci, Pittsburgh, PA (US)

(73) Assignee: ADVANTECH GLOBAL, LTD, Tortola (VG)

( * ) Notice: Subject to any disclaimer, the term of this patent is extended or adjusted under 35 U.S.C. 154(b) by 0 days.

(21) Appl. No.: 14/748,685

(22) Filed: Jun. 24, 2015

(65) Prior Publication Data

US 2016/0170315 A1   Jun. 16, 2016

Related U.S. Application Data

(63) Continuation-in-part of application No. 14/265,773, filed on Apr. 30, 2014, and a continuation of
(Continued)

(51) Int. Cl.
*G03F 7/20* (2006.01)
*C23C 16/04* (2006.01)
(Continued)

(52) U.S. Cl.
CPC ........ *G03F 7/70733* (2013.01); *C23C 14/042* (2013.01); *B05B 15/045* (2013.01); *B05B 15/0456* (2013.01); *B05B 15/0481* (2013.01); *C23C 14/04* (2013.01); *H01J 29/073* (2013.01); *H01J 2229/07* (2013.01); *H01J 2229/0705* (2013.01); *H01J 2229/0711* (2013.01); *H01J 2229/0716* (2013.01); *H01J 2229/0722* (2013.01); *H01J 2229/0727* (2013.01);
(Continued)

(58) Field of Classification Search
CPC ... G03F 7/70733; C23C 16/04; C23C 16/042; C23C 14/042; B05B 15/0481; B05B 15/045; B05B 15/0456; Y10T 29/53961; Y10T 29/49867; H01J 2229/07; H01J 2229/0705; H01J 2229/0711; H01J 2229/0716; H01J 2229/0727; H01J 29/073
USPC ... 29/281, 448; 118/213, 301, 406, 504, 505
See application file for complete search history.

(56) References Cited

U.S. PATENT DOCUMENTS 2,625,734 A    1/1953 Law
3,794,873 A *  2/1974 Kaplan ................... H01J 29/07
                                                 313/349
(Continued)

FOREIGN PATENT DOCUMENTS

KR    1020090110979 A    10/2009

*Primary Examiner* — Christopher Besler
*Assistant Examiner* — Bayan Salone
(74) *Attorney, Agent, or Firm* — The Webb Law Firm

(57) ABSTRACT

In a system and method of shadow mask tensioning, an object having second set of alignment features is positioned on a side of shadow mask having a first set of alignment features such that the object and the shadow mask can move independently of each other and the first and second sets of alignment features are not in final alignment. Tension is then applied to the shadow mask to bring the first set of alignment features into final alignment with the second set of alignment features. The alignment features of the shadow mask can include at least one deposition aperture of the shadow mask.

20 Claims, 14 Drawing Sheets

Related U.S. Application Data application No. PCT/US2015/026447, filed on Apr. 17, 2015, which is a continuation-in-part of application No. 14/265,773, filed on Apr. 30, 2014.

(60) Provisional application No. 61/817,974, filed on May 1, 2013.

(51) Int. Cl.
  *C23C 14/04* (2006.01)
  *B05B 15/04* (2006.01)
  *H01J 29/07* (2006.01)

(52) U.S. Cl.
  CPC .... *Y10T 29/49867* (2015.01); *Y10T 29/53957* (2015.01); *Y10T 29/53961* (2015.01)

(56) References Cited

U.S. PATENT DOCUMENTS

| | | | |
|---|---|---|---|
| 3,894,321 A * | 7/1975 | Moore | H01J 29/07 313/402 |
| 4,721,488 A * | 1/1988 | Dougherty | H01J 9/00 29/448 |
| 4,772,238 A | 9/1988 | Horn et al. | |
| 4,824,412 A | 4/1989 | Dougherty et al. | |
| 4,887,988 A * | 12/1989 | Canevazzi | H01J 29/073 445/30 |
| 4,894,037 A | 1/1990 | Fendley et al. | |
| 5,667,128 A * | 9/1997 | Rohde | H01L 21/67144 228/49.5 |
| 7,531,216 B2 * | 5/2009 | Brody | C23C 14/042 427/248.1 |
| 7,674,148 B2 * | 3/2010 | Griffin | C23C 14/042 445/30 |
| 7,765,669 B2 * | 8/2010 | Kim | G03F 1/14 118/504 |
| 8,490,271 B2 | 7/2013 | Harvilchuck et al. | |
| 2006/0024444 A1 * | 2/2006 | Brody | C23C 14/042 427/282 |
| 2006/0158088 A1 | 7/2006 | Kim et al. | |
| 2007/0190888 A1 * | 8/2007 | Griffin | C23C 14/042 445/30 |
| 2007/0190889 A1 * | 8/2007 | Lee | C23C 14/042 445/47 |
| 2008/0289754 A1 * | 11/2008 | Sone | C23C 14/042 156/272.2 |
| 2009/0146355 A1 | 6/2009 | Harvilchuck et al. | |
| 2015/0068456 A1 | 3/2015 | Kuriyama et al. | |

* cited by examiner

SHADOW MASK TENSIONING METHOD AND APPARATUS

CROSS REFERENCE TO RELATED APPLICATIONS

This application is a continuation of PCT/US2015/026447, filed Apr. 17, 2015, which is a continuation-in-part (CIP) of U.S. application Ser. No. 14/265,773, filed Apr. 30, 2014. This application is also a CIP of U.S. application Ser. No. 14/265,773, filed Apr. 30, 2014, which claims the benefit of U.S. Provisional Application No. 61/817,974, filed May 1, 2013. PCT/US2015/026447, U.S. application Ser. No. 14/265,773, and U.S. Provisional Application No. 61/817,974 are all incorporated herein by reference.

BACKGROUND OF THE INVENTION

Field of the Invention

The present invention generally relates to the field of thin film electronic devices fabricated by additive manufacturing methods. In particular, the present invention is directed to a shadow mask used for patterning materials such as metals, oxides, and OLED compounds.

Description of Related Art

There is currently great interest in additive manufacturing methods for fabrication of thin film devices. Such methods would offer an alternative to established methods such as photolithography. Investigating alternatives to photolithography is of interest because photolithography requires significant facility floor space, requires numerous complex steps per patterned feature, and produces significant toxic chemical waste.

It is known in the art of additive manufacturing to employ the method of shadow masking. Shadow masking involves placing a substrate in close proximity or contact with a shadow mask that includes numerous formed apertures. Subsequently, material is deposited through the apertures, yielding the desired pattern on the substrate. Most often several shadow masks are required to produce a desired thin film device. Thus, it is necessary to precisely align the series of shadow masks with reference points on the substrate.

Typically, thin film devices require features to be accurately located within no more than a few micrometers of their specified location. Current alignment methods are capable of accurately placing the center of the shadow mask within less than 1 µm of its desired location. However, the shadow mask typically contains features over a significant area, hereinafter referred to as the "array." Therefore, the size of the array must be controlled very precisely if the features of several masks are to be placed within their specified areas.

Because of the desired patterned feature sizes (typically >100 µm), the shadow mask is typically made of a thin metal foil less than 100 µm thick. Such a thin material does not have the structural integrity to be easily and safely handled on its own. Additionally, the shadow mask will be subject to elevated temperature during the deposition process and it is desired that the apertures of the array remain at constant locations during the thermal cycling. Therefore, tensioning the shadow mask and mounting the shadow mask to a rigid frame allows the shadow mask to be easily and safely handled while being robust to temperature changes.

Heretofore, heat was used to tension the shadow mask before it was attached to the frame. In this method, the frame is made of a low coefficient of thermal expansion alloy, such as invar. The frame and shadow mask are heated to a temperature where the array grows, via thermal expansion, to the proper size and an adhesive bonds the shadow mask to the frame. As the assembly cools, the shadow mask contracts more than the frame resulting in a tensioned shadow mask. This method of thermal tensioning does work but it has limitations and requires significant skill of the fabricator.

One limitation of thermal tensioning is that heat causes the shadow mask to expand proportionally in all directions. This method would be sufficient if all pre-mounted shadow masks are dimensionally accurate to the micrometer level. However, shadow masks often do not start with correct proportions. An example of this concept is shown in FIG. 1. In this example, the particular shadow mask requires more stretch in the horizontal direction than in the vertical direction. The best course of action for mounting this shadow mask using thermal tensioning is to select a mounting temperature that splits the difference between the two desired dimensions. This introduces dimensional inaccuracies to the array of this shadow mask which could cause the shadow mask to become unusable. Therefore, the inability to adjust shadow mask dimensions independently is a limitation of thermal stretching.

When shadow masks are mounted via thermal tensioning, the selected mounting temperature should be higher than the maximum temperature realized at the shadow mask during deposition. When this is done the patterned features are generally observed to remain in their starting locations over the course of the thermal cycling of the deposition. According to observations, this starting location is the "cold" or room temperature dimension of the shadow mask. This differs from the mounting, "hot," dimension of the shadow mask. When the shadow mask cools from the mounting temperature and becomes tensioned, the array changes in dimension. This concept is shown in FIG. 2. This process is somewhat repeatable in that shadow masks with the same aperture pattern tend to deform in the same fashion when transitioning from hot to cold states. However, achieving acceptable shadow mask mounting results requires collecting extensive data on the behavior of shadow masks and significant decision making from the fabricator. Further, transition from hot to cold can result in bowing of the array, a problem that cannot be directly addressed in the thermal tensioning process.

Including an elevated temperature within the mounting process also adds further complications. Introducing an environment of elevated and adjustable temperature greatly complicates the task of making the accurate micrometer scale measurements that are required for a precise shadow mask. Additionally, since it is continually desired to mount shadow masks at increasingly high temperatures, ease of handling and even operator safety become a concern.

SUMMARY OF THE INVENTION

Various preferred and non-limiting examples of the present invention will now be described and set forth in the following numbered clauses:

Clause 1: In an example, a shadow mask tensioning method is disclosed comprising: (a) positioning a shadow mask frame and an anchor frame in spaced relation defining a gap therebetween; (b) positioning a shadow mask having at least one first alignment feature on the shadow mask frame and the anchor frame with a portion of the shadow mask extending across the gap; (c) affixing the shadow mask to the anchor frame; (d) positioning an object including at least one second alignment feature on a side of the shadow mask opposite the anchor frame with the second alignment feature not in final alignment with the first alignment feature; (e) following steps (a)-(d), tensioning the shadow mask by urging the portion of the shadow mask into the gap thereby bringing the first alignment feature into alignment with the second alignment feature; and (f) following step (e), affixing the shadow mask to the shadow mask frame.

Clause 2: The method of clause 1, wherein step (c) can include affixing multiple edges of the shadow mask to the anchor frame.

Clause 3: The method of clause 1 or 2, wherein the method can further include (g), following step (f), separating the shadow mask affixed to the shadow mask frame from the anchor frame.

Clause 4: The method of any one of clauses 1-3, wherein step (g) can include cutting the portion of the shadow mask extending across the gap.

Clause 5: The method of any one of clauses 1-4, wherein: the shadow mask can include an edge tab; the portion of the shadow mask can be the edge tab; step (c) can include affixing the edge tab of the shadow mask to the anchor frame; and step (g) can include separating the edge tab from the shadow mask affixed to the shadow mask frame.

Clause 6: The method any one of clauses 1-5, wherein: the method can further include affixing to the anchor frame a tensioning frame that supports a plurality of tensioning screws in alignment with the gap; and step (e) can include adjusting (rotating) the plurality of tensioning screws in a manner to urge the portion of the shadow mask into the gap.

Clause 7: The method of any one of clauses 1-6, wherein step (e) can further include, in response to physical distortion of one or more deposition apertures of the shadow mask caused by adjusting the plurality of tensioning screws, adjusting a subset of the plurality of tensioning screws to undo the physical distortion.

Clause 8: The method of any one of clauses 1-7, wherein the gap and the portion of the shadow mask can surround the shadow mask frame.

Clause 9: The method of any one of clauses 1-8, wherein the object can be a transparent sheet.

Clause 10: The method of any one of clauses 1-9, wherein step (d) can include supporting the object such that the shadow mask can move independent of the object.

Clause 11: The method of any one of clauses 1-10, wherein the at least one first alignment feature can be a deposition aperture of the shadow mask.

Clause 12: In another example, a shadow mask tensioning apparatus is disclosed comprising: means for supporting a shadow mask that includes one or more first alignment features with a portion of the shadow mask that surrounds the one or more first alignment features in alignment with a gap; means for anchoring the shadow mask; an object including one or more second alignment features configured to be positioned on a side the shadow mask; and means for urging the portion of the shadow mask that surrounds the one or more first alignment features into the gap thereby bringing the one or more first alignment features into alignment with the one or more second alignment features.

Clause 13: The apparatus of clause 12, wherein the means for supporting can include a shadow mask frame surrounded in spaced relation by an anchor frame defining the gap between the shadow mask frame and the anchor frame.

Clause 14: The apparatus of clause 12 or 13, wherein the means for anchoring can include an anchor bar and the anchor frame sandwiching an edge of the shadow mask therebetween.

Clause 15: The apparatus of any one of clauses 12-14, wherein at least one of the first alignment features can comprise a deposition aperture of the shadow mask.

Clause 16: The apparatus of any one of clauses 12-15, wherein the means for urging can include a tensioning frame supporting tensioning screws in alignment with the portion of the shadow mask that surrounds the one or more deposition apertures. The tensioning screws can be operative for urging the portion of the shadow mask into the gap in response to rotation of the tensioning screws.

Clause 17: The apparatus of any one of clauses 12-16, wherein the object can be a transparent sheet.

Clause 18: The apparatus of any one of clauses 12-17, wherein the apparatus can further include means for supporting the object such that the shadow mask can move independently of the object.

Clause 19: In another example, a shadow mask tensioning method is disclosed comprising: (a) arranging an object having a second set of alignment features on a side of shadow mask having a first set of alignment features such that the object and the shadow mask can move independently of each other and the first and second sets of alignment features are not in final alignment; and (b) applying tension to the shadow mask to bring the first set of alignment features into final alignment with the second set of alignment features.

Clause 20: The method of clause 19, wherein the first set of alignment features can comprise at least one deposition aperture of the shadow mask.

DESCRIPTION OF THE INVENTION

The present invention will now be described with reference to the accompanying figures where like reference numbers correspond to like elements.

Figure 1:
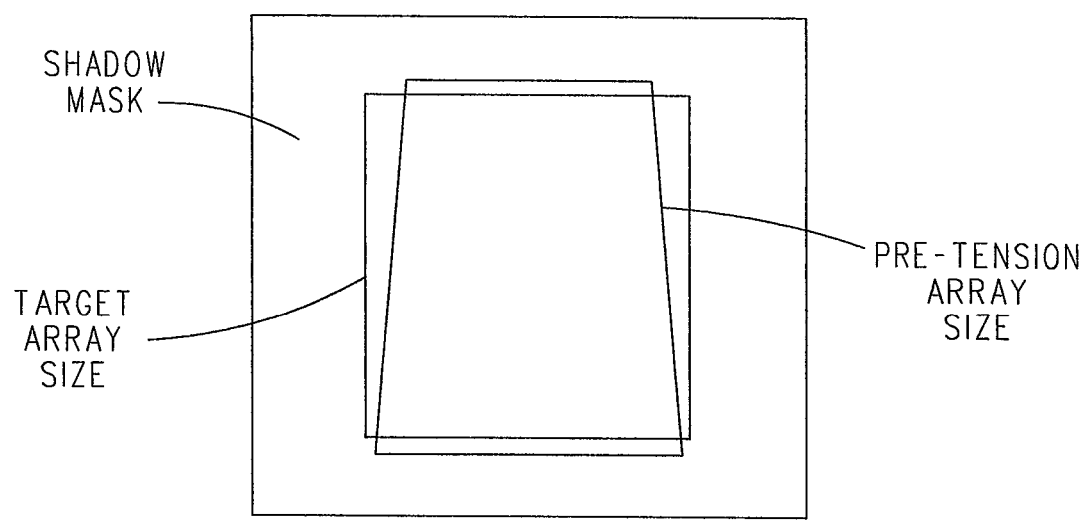
FIG. 1 is an illustration of a difference between a pre-tension shadow mask array size versus a target array size for said shadow mask.
Figure 2:
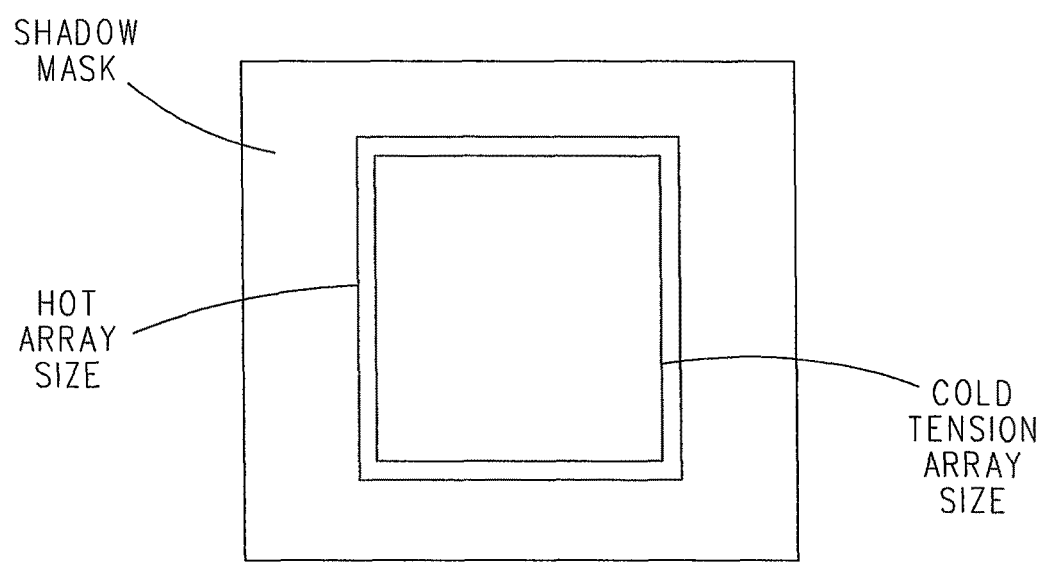
FIG. 2 is an illustration of a difference between a hot array size and a cold, tensioned array size of a shadow mask in accordance with a thermal tensioning process.
Figure 3:
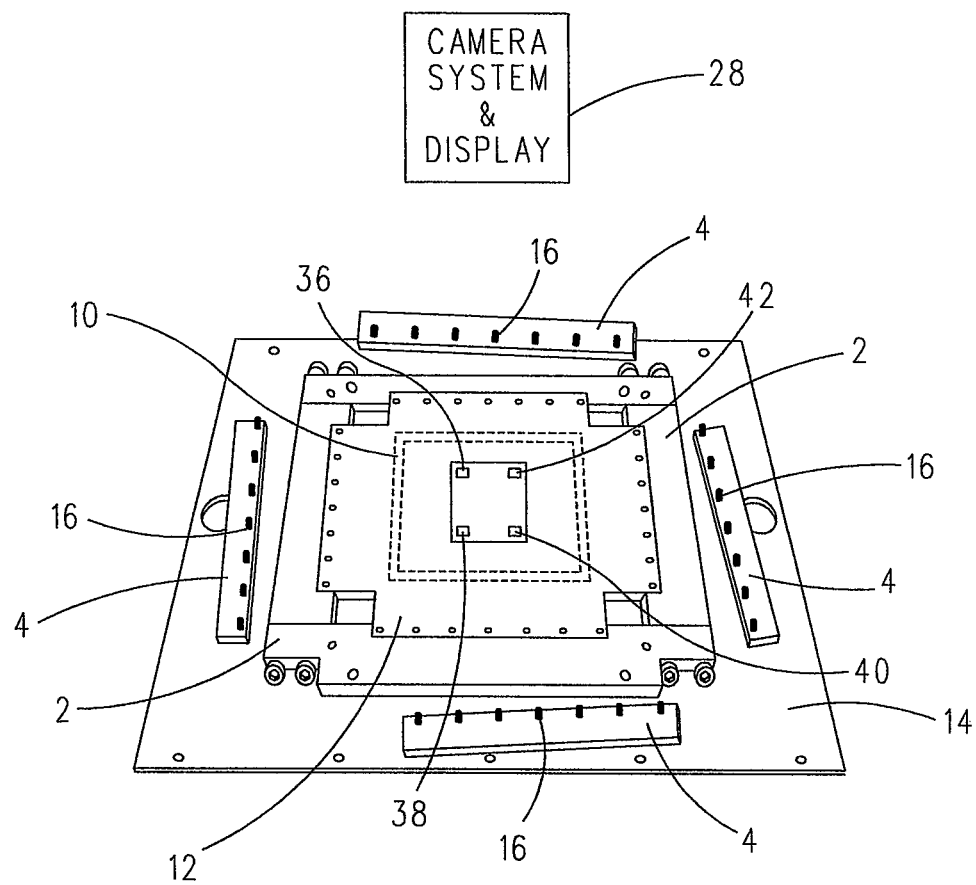
FIG. 3 is a perspective view of a shadow mask disposed on an anchor frame in accordance with an embodiment of the invention.

With reference to FIG. 3, disclosed herein is a shadow mask tensioning system that includes an anchor frame 2, a plurality of anchor bars 4, a tensioning frame 6 (FIG. 5) including a number of tensioning screws 8, a shadow mask frame 10 (shown in phantom in FIG. 3), and a shadow mask 12, all supported by a support plate 14. Anchor frame 2 is a metal frame designed to support shadow mask 12 before and during tensioning. FIG. 3 shows anchor frame 2 and also illustrates the location where shadow mask 12 is affixed to anchor frame 2. Depending on the size constraints for shadow mask frame 10, which in use is positioned between shadow mask 12 and support plate 14 (see FIG. 9), anchor frame 2 could be integrated into shadow mask frame 10 as a single unit.

Figure 4:
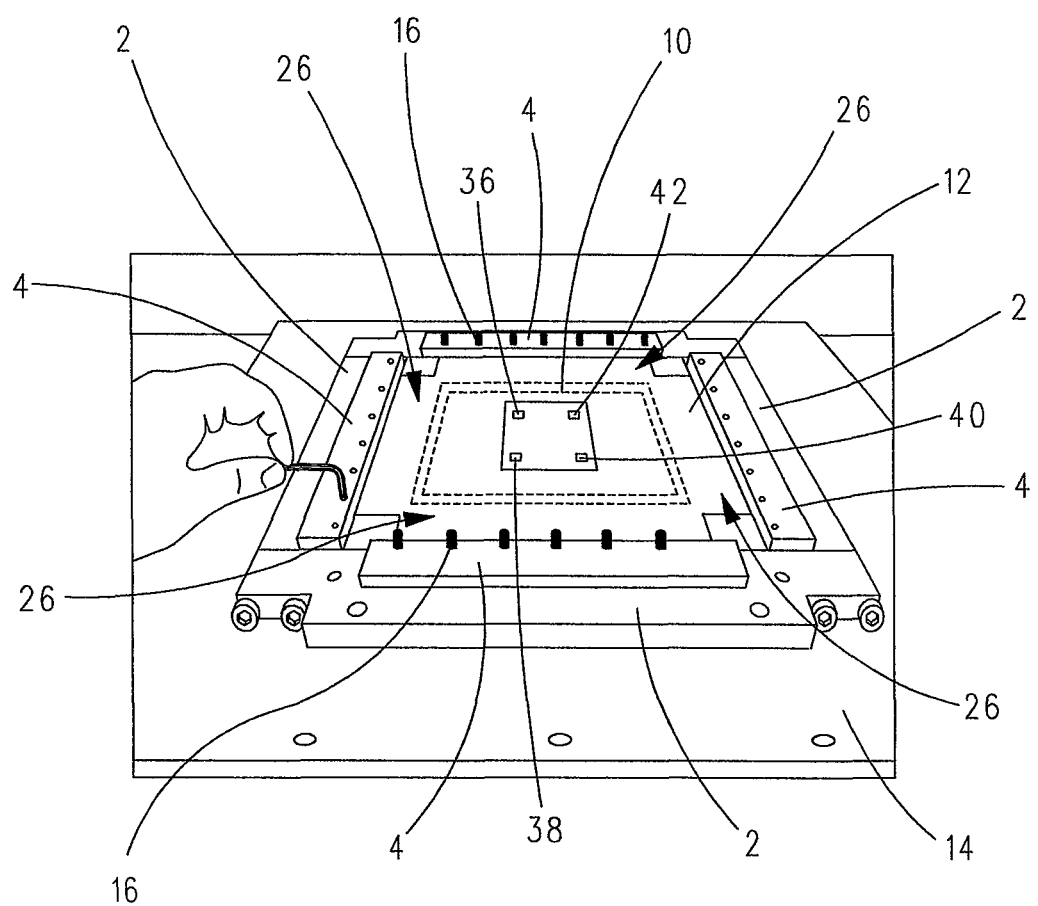
FIG. 4 is a perspective view of anchor bars being attached to the anchor frame to secure or affix the shadow mask to the anchor frame.

With reference to FIG. 4, shadow mask 12 is affixed to anchor frame 2 by clamping the edges of shadow mask 12 to anchor frame 2 with anchor bars 4. Threaded bolts 16 pass through threaded apertures in anchor bars 4 and apertures along the edges of shadow mask 12, and are threaded into threaded holes in anchor frame 2 to secure the edges of shadow mask 12 in fixed locations.

Figure 5:
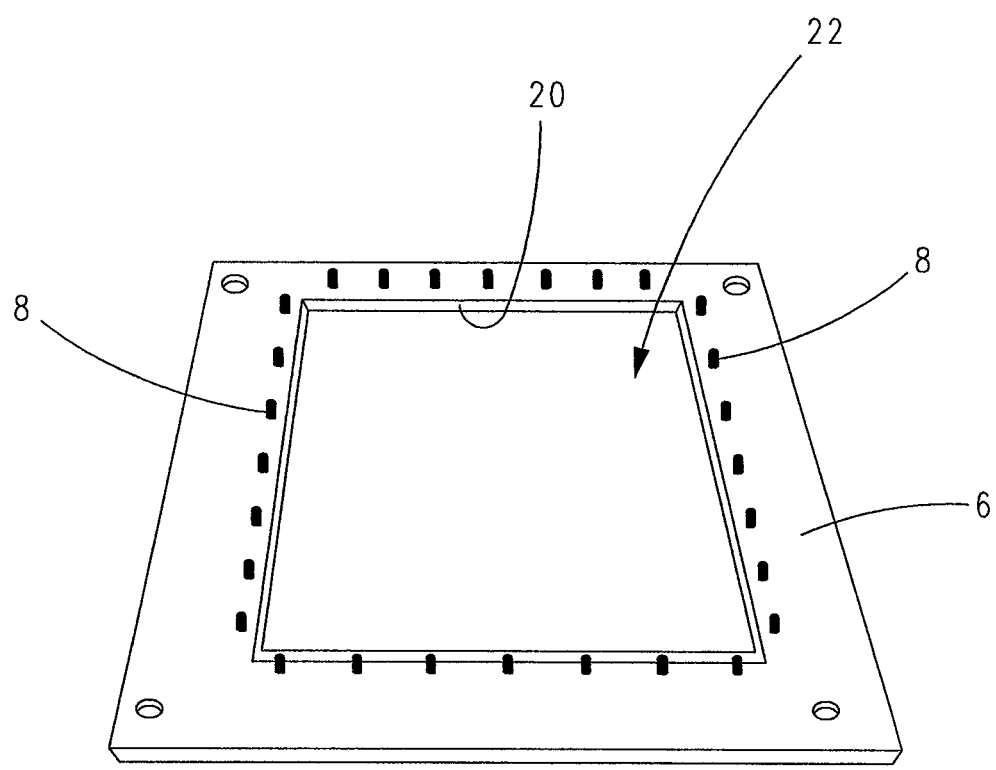
FIG. 5 is an isolated perspective view of a tensioning frame including fine pitched tensioning screws disposed in threaded apertures of the tensioning frame.
Figure 6:
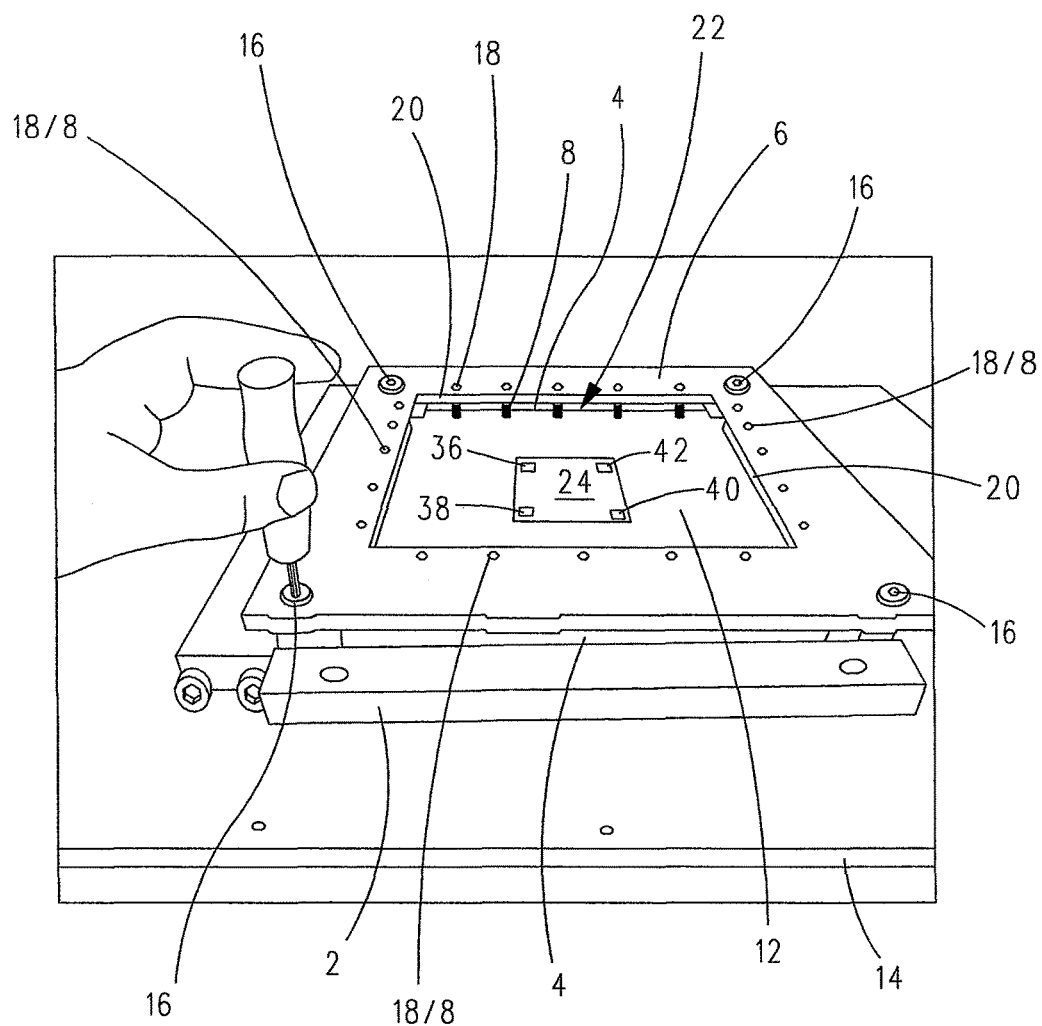
FIG. 6 is a perspective view of the tensioning frame of FIG. 5 being secured to the anchor frame after mounting of the anchor bars to the anchor frame.

With reference to FIGS. 5 and 6, tensioning frame 6 is then attached atop of anchor frame 2 and anchor bars 4 with bolts 16. Tensioning frame 6 includes a series of holes 18 an inner perimeter 20 of an aperture 22 of tensioning frame 6. These holes 18 include either fine pitch threads or inserts which contain fine pitch threads. In either case, fine pitch tensioning screws 8 are threaded through these holes 18 as a means of tensioning shadow mask 12.

Shadow mask frame 10 is a metal frame to which shadow mask 12 is attached. Shadow mask frame 10 facilitates shadow mask 12 being easily handled and aligned for a deposition event and also to fix shadow mask 10 when tensioned at a desired dimension.

Figure 7:
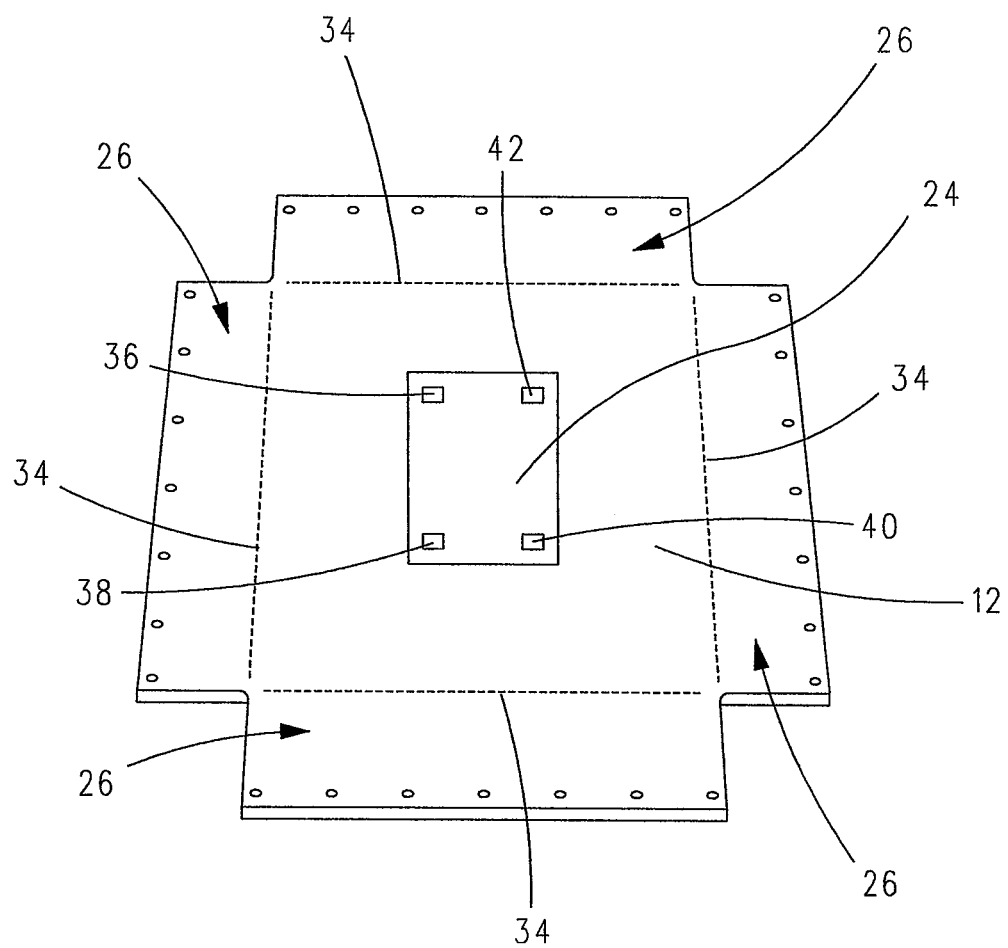
FIG. 7 is an isolated perspective view of the shadow mask including a central array of apertures and edge tabs for tensioning.

With reference to FIG. 7, shadow mask 12 is comprised of a square or rectangular, thin metal foil with an array of apertures 24, desirably formed in a central portion of shadow mask 12. In the illustrated embodiment, shadow mask 12 includes edge tabs 26, which are used to apply tension to shadow mask 12 in the manner described herein.

It is desired for tensioning of shadow mask 12 to occur in a conventional temperature controlled cleanroom environment. The first step is to place shadow mask 12 on anchor frame 2 and shadow mask frame 10 as shown in FIG. 3. Next, anchor bars 4 are attached to anchor frame 2 sandwiching edge tabs 26 therebetween, as shown in FIG. 4. This is followed by attachment of tensioning frame 6 to anchor frame 2, as shown in FIG. 6. Shadow mask 12 can now be tensioned until the array of apertures 24 achieves a desired shape, as determined, for example, by an overhead camera system and visual display 28 (FIG. 3).

Figure 8:
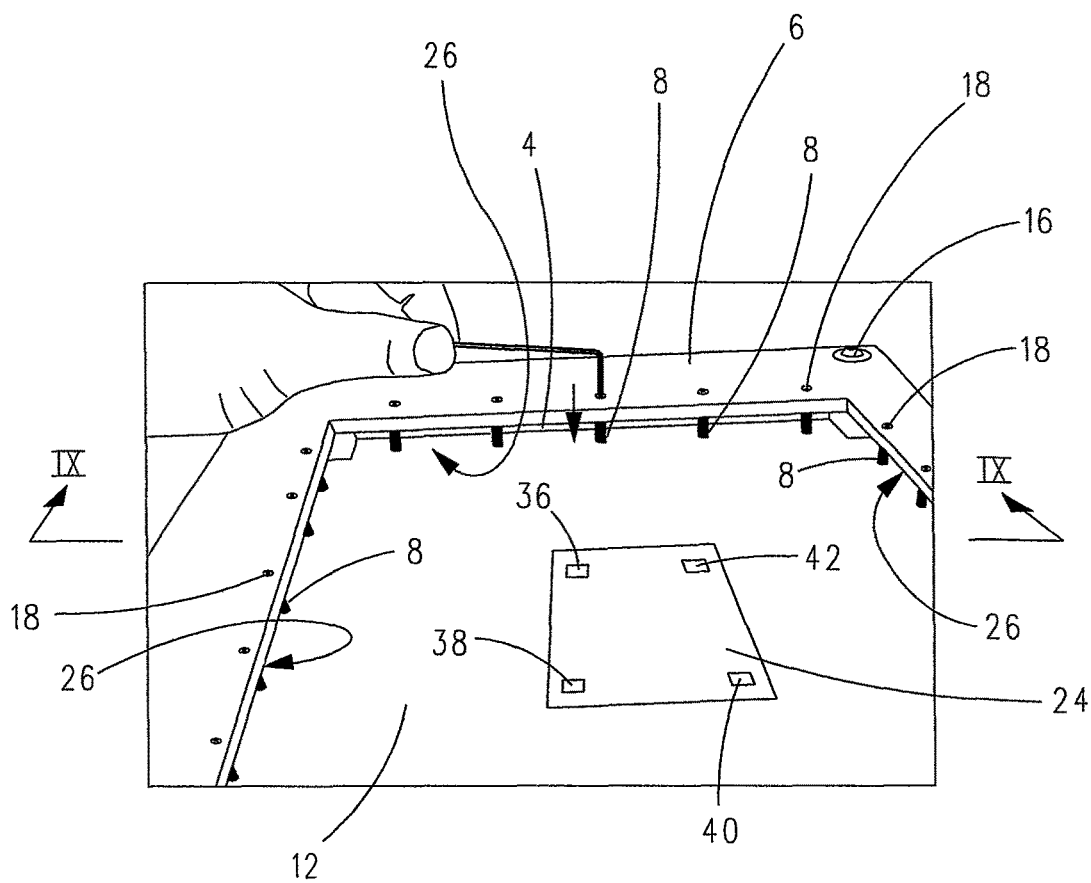
FIG. 8 is an enlarged perspective view of a fine pitch tensioning screw being rotated to press down on an edge tab to create tension in the shadow mask.
Figure 9:
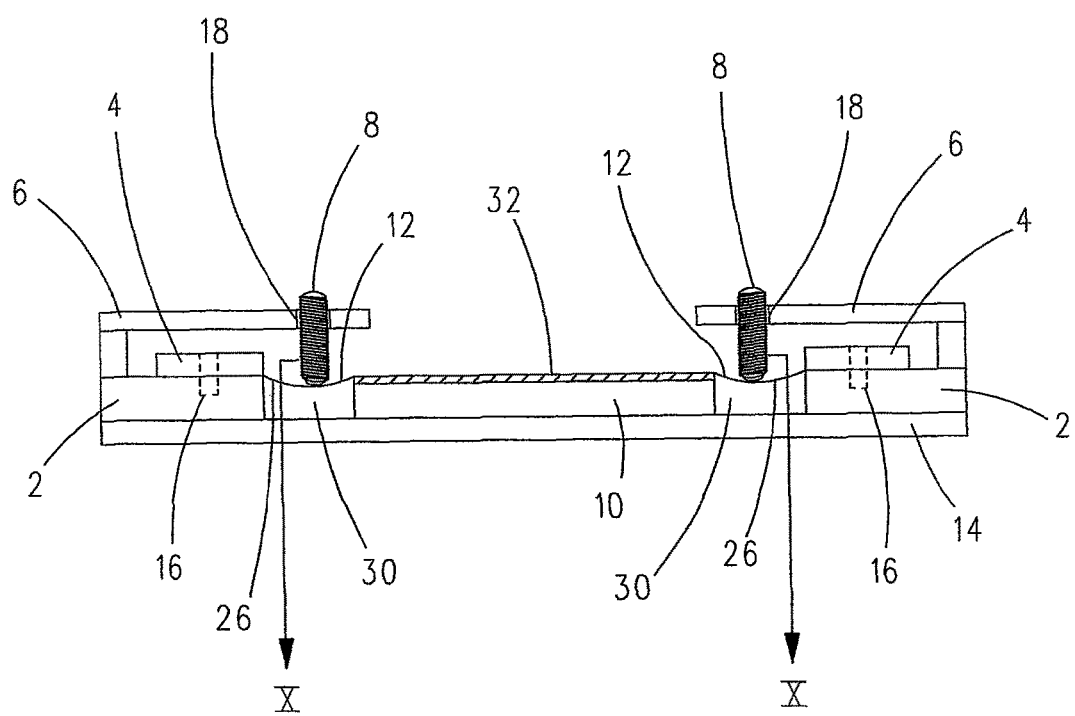
FIG. 9 is a cross-sectional view taken along lines IX-IX in FIG. 8 showing a shadow mask rigidly clamped on both sides with fine pitch tensioning screws pressed into edge tabs, whereupon the shadow mask is stretched across the surface of a shadow mask frame.

With references to FIGS. 8 and 9, tension is applied to shadow mask 12 by tightening fine pitch tensioning screws 8 located in holes 18 of tensioning frame 6. As each tensioning screw 8 presses down on edge tab 26 of shadow mask 12, an interior portion of the edge tab 26 of shadow mask 12 in contact with tensioning screw 8 is forced into a gap 30 (FIG. 9) defined between anchor frame 2 and shadow mask frame 10 whereupon tension is created within shadow mask 12. More specifically, as each fine pitch tensioning screw 8 is extended downward, shadow mask 12 is stretched tight across the surface of shadow mask frame 10. Overall tension and the resulting shape of shadow mask 12 can be varied by adjusting the pressure applied by each tensioning screw 8 on the corresponding edge tab 26 by turning each tensioning screw 8 clockwise and/or counter-clockwise within one of the threaded holes 18 of tensioning frame 6.

When the array of apertures 24 has achieved a desired shape and size, an adhesive 32 (FIG. 9) is applied to bond shadow mask 12 to shadow mask frame 10. Once shadow mask 12 has been bonded, edge tabs 26 are removed from shadow mask 12 in any suitable and/or desirable manner, e.g., cut along dashed lines 34 (FIG. 7) with a utility knife, and shadow mask frame 10 and shadow mask 12 are separated from support plate 14, anchor frame 2, anchor bars 4, tensioning frame 6, etc.

The embodiment described herein has several advantages over the prior art. First, since tension within shadow mask 12 is created by adjustments at numerous locations around the perimeter of shadow mask 12, there is significant flexibility in the shape of the metal foil that comprises shadow mask 12 and, hence, the shape of the array of apertures 24. Horizontal and vertical dimensions of the array of apertures 24 can be adjusted separately. It is also possible to adjust the tension of shadow mask 12 so that the array of apertures 24 does not bow.

Since tensioning of shadow mask 12 can occur in a conventional temperature controlled cleanroom environment, precise metrology of the array of apertures 24 becomes a more simple task. Also, since shadow mask 12 does not go through the "hot" state of being thermally expanded but, instead is tensioned directly in a "cold" state, accurate dimensions of the array of apertures 24 are more easily achieved. This is because the operator does not have to compensate for how they believe the shadow mask dimensions will change when the assembly cools. Finally, since no heat is involved in the tensioning process, there is no chance of burn injury.

Figure 10:
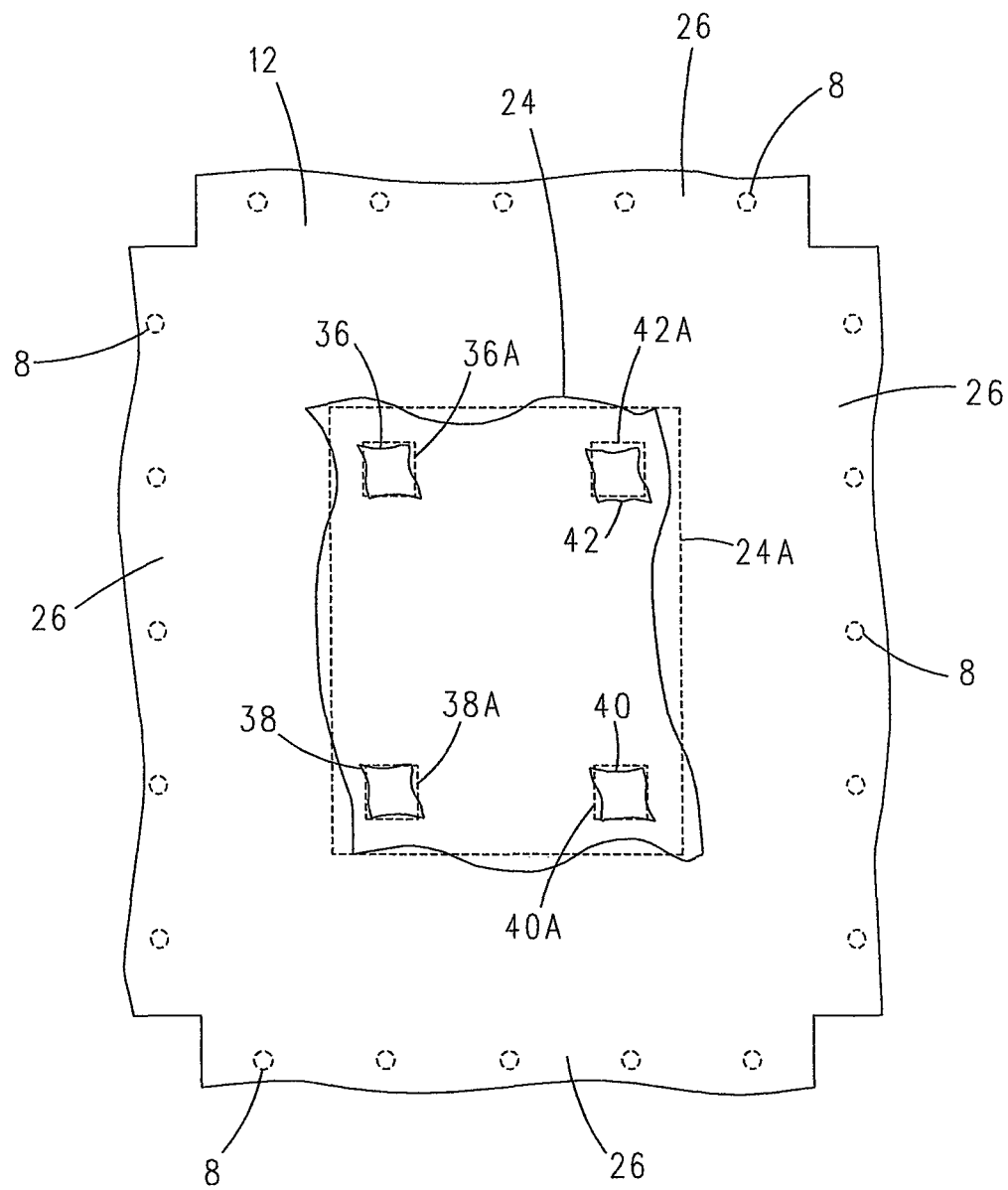
FIG. 10 is a cross-section taken along lines X-X in FIG. 9 showing a highly exaggerated view of the physical and/or geometrical distortion of the array of apertures of the shadow mask shown in FIG. 9 in response to the tensioning process caused by the fine pitch tensioning screws pressing into edge tabs.

With reference to FIG. 10 and with continued reference to all previous figures, during tensioning of shadow mask 12 by adjusting the pressure applied by each tension screw 8 to the corresponding edge tab 26 of shadow mask 12, is not uncommon for the array of apertures 24 or one or more of the apertures of the array of apertures 24 to become physically and/or geometrically distorted due to the tensioning process. For example, FIG. 10 shows a highly exaggerated distorted solid line box 24 analogous to the array of apertures 24 discussed above. The array of apertures represented by box 24 in FIG. 10 can include a first set of one or more alignment features 36, 38, 40 and/or 42 (shown in solid lines), for example, that can also be distorted. In FIG. 10, dashed line 24A shows the desired shape of box 24 representative of the array of apertures 24 discussed above. Similarly, dash lines 36A, 38A, 40A, and 42A show non-limiting examples of the desired shapes of alignment features 36, 38, 40, and 42, respectively. As noted above, the physical or geometrical distortion of the array of apertures represented by box 24 or the individual alignment features represented by boxes 36, 38, 40, and 42 can be caused by improper tensioning of shadow mask 12 via tensioning screws 8 on the corresponding edge tabs 26 of shadow mask 12.

Figure 11:
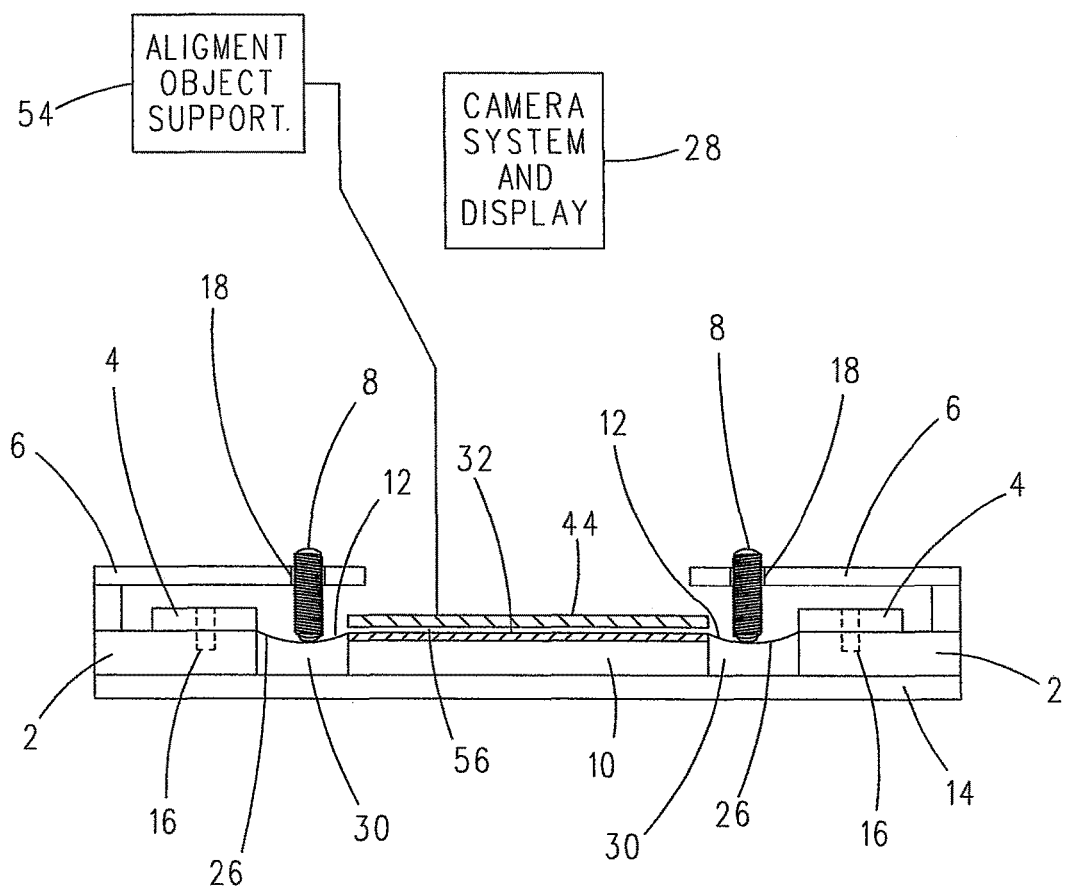
FIG. 11 is a cross section of FIG. 9 including an object positioned on the shadow mask to facilitate overcoming the physical and/or geometrical distortion of the shadow mask shown in FIG. 10 due to the tensioning process.
Figure 12:
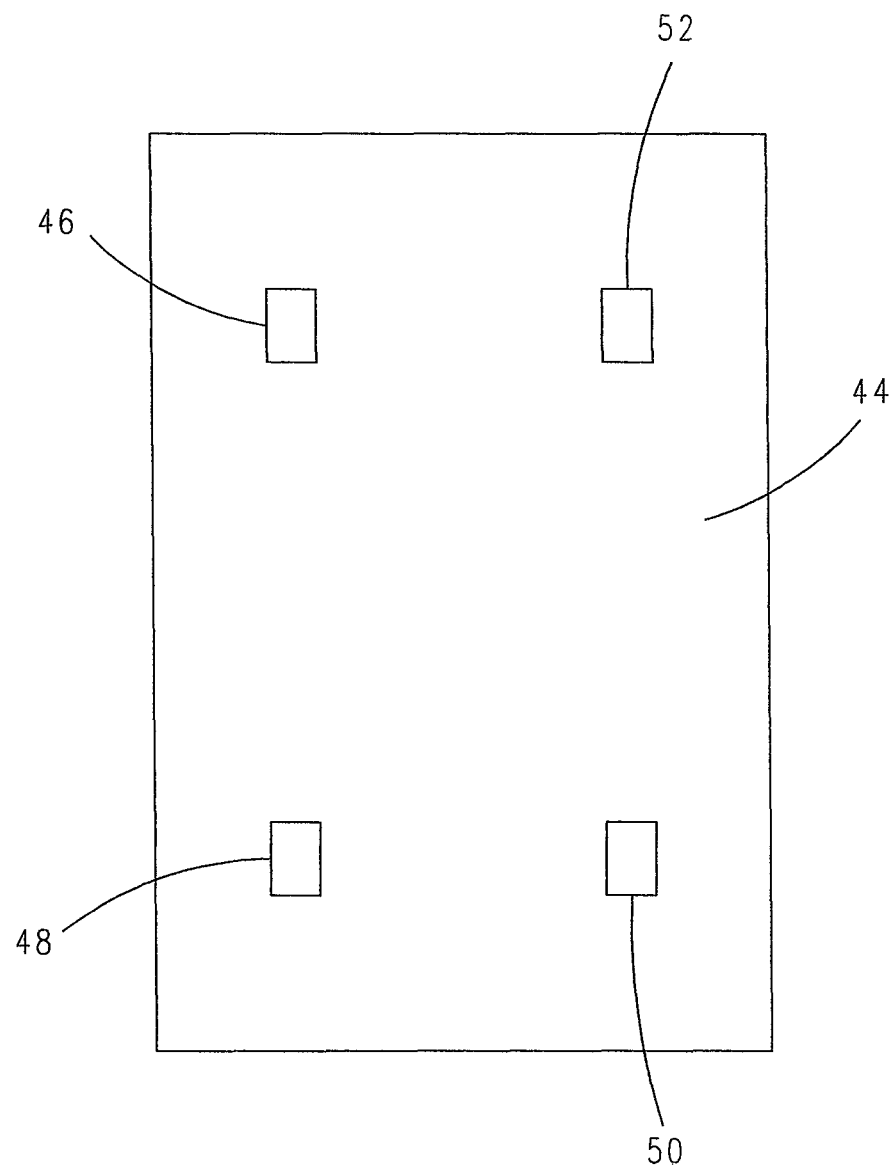
FIG. 12 is a plan view of the object shown in FIG. 11 in the form of a transparent sheet.

With reference to FIGS. 11 and 12, and with ongoing reference to all previous figures, to help overcome this physical or geometrical distortion problem caused by the adjustment of the pressure applied by each tensioning screw 8 on the corresponding edge tab 26 of shadow mask 12 shown highly exaggerated in FIG. 10, an object 44 can be positioned on one side of shadow mask 12, e.g., on a side of shadow mask 12 opposite shadow mask frame 10. In an example, object 44 can be a transparent sheet. However, this is not to be construed as limiting the invention.

Object 44, for example, in the form of a transparent sheet, can include a second set of one or more of alignment features 46, 48, 50, and 52 (FIG. 12). In an example, alignment features 46-52 are shown as being square or rectangular in shape. However, this is not to be construed as limiting the invention since it is envisioned that each alignment features 46-52 of object 44 can be of any suitable and/or desirable shape, including circular, triangular, or any suitable and/or desirable shape. Similarly, each alignment feature 36-42 of shadow mask 12 can be of any suitable or desirable shape.

In an example, an alignment object support 54 (FIG. 11) can be provided that is coupled to object 44 to support object 44 such that shadow mask 12 can move independent of object 44. In an example, alignment object support 54 can support object 44 in spaced relation to shadow mask 12 with an optional small gap 56 between object 44 and shadow mask 12.

Figure 13:
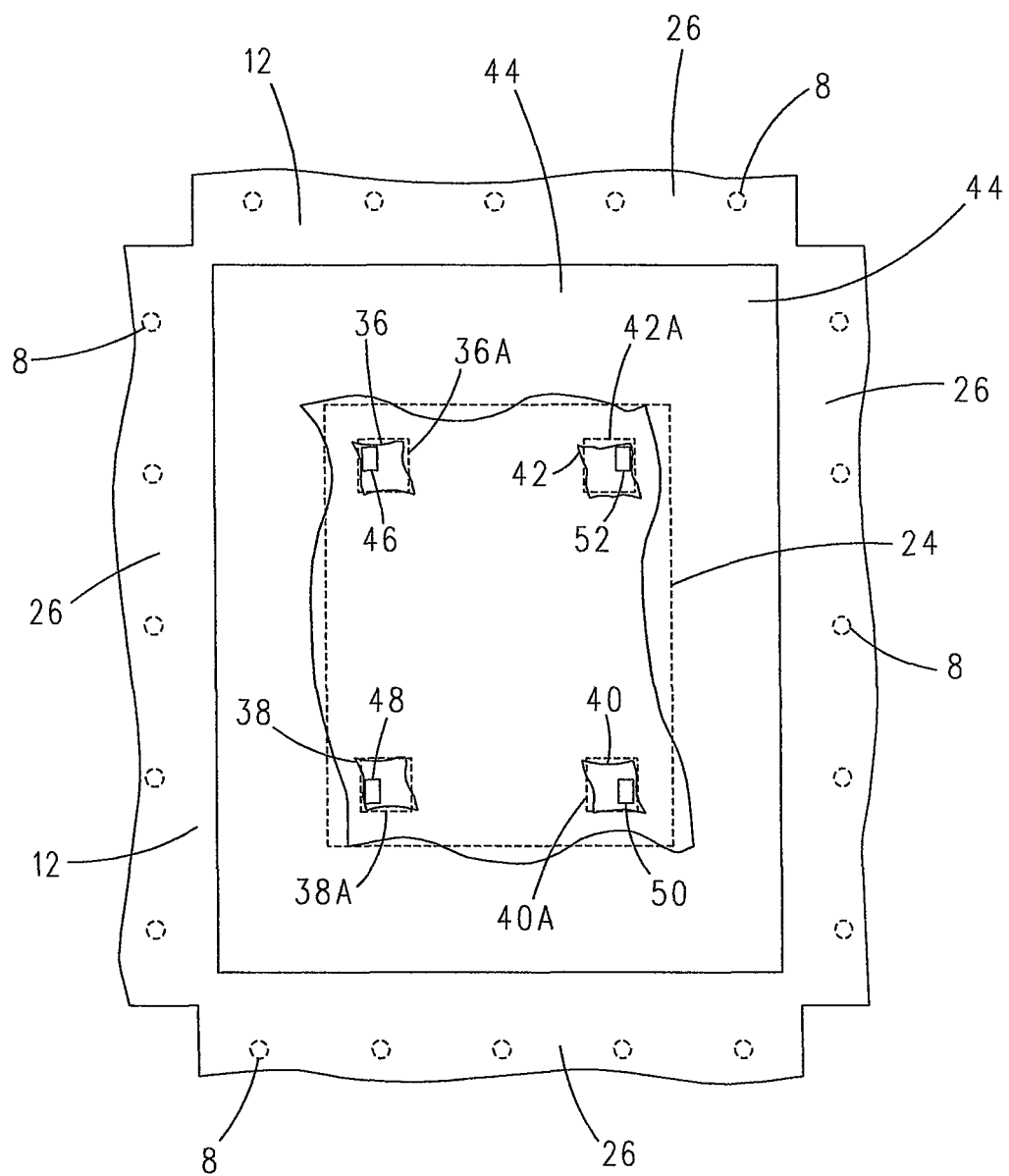
FIG. 13 is a plan view the object of FIG. 12 positioned over the shadow mask shown in FIG. 10.

With reference to FIG. 13 and with continuing reference to all previous figures, FIG. 13 shows object 44 (FIG. 12) positioned over shadow mask 12 (FIG. 10), with the second set of alignment features 46-52 of object 44 positioned in coarse alignment with the first set of alignment features 36-42 of shadow mask 12. Herein, the first set of alignment features of shadow mask 12 includes one or more of alignment features 36-42 and the second set of alignment features of object 44 includes one or more of alignment features 46-52. However, this is not to be construed in a limiting sense.

By observing the positions of the second set of alignment features 46-52 while adjusting the tension applied to shadow mask 12 via adjusting a subset of tensioning screws 8, shadow mask 12 can be tensioned via the tension applied to one or more edge tabs 26 of shadow mask 12 by the tensioning screws 8 in a way that brings the first set of alignment features 36-42 into fine or precise alignment with the second set of alignment features 46-52, respectively.

Figure 14:
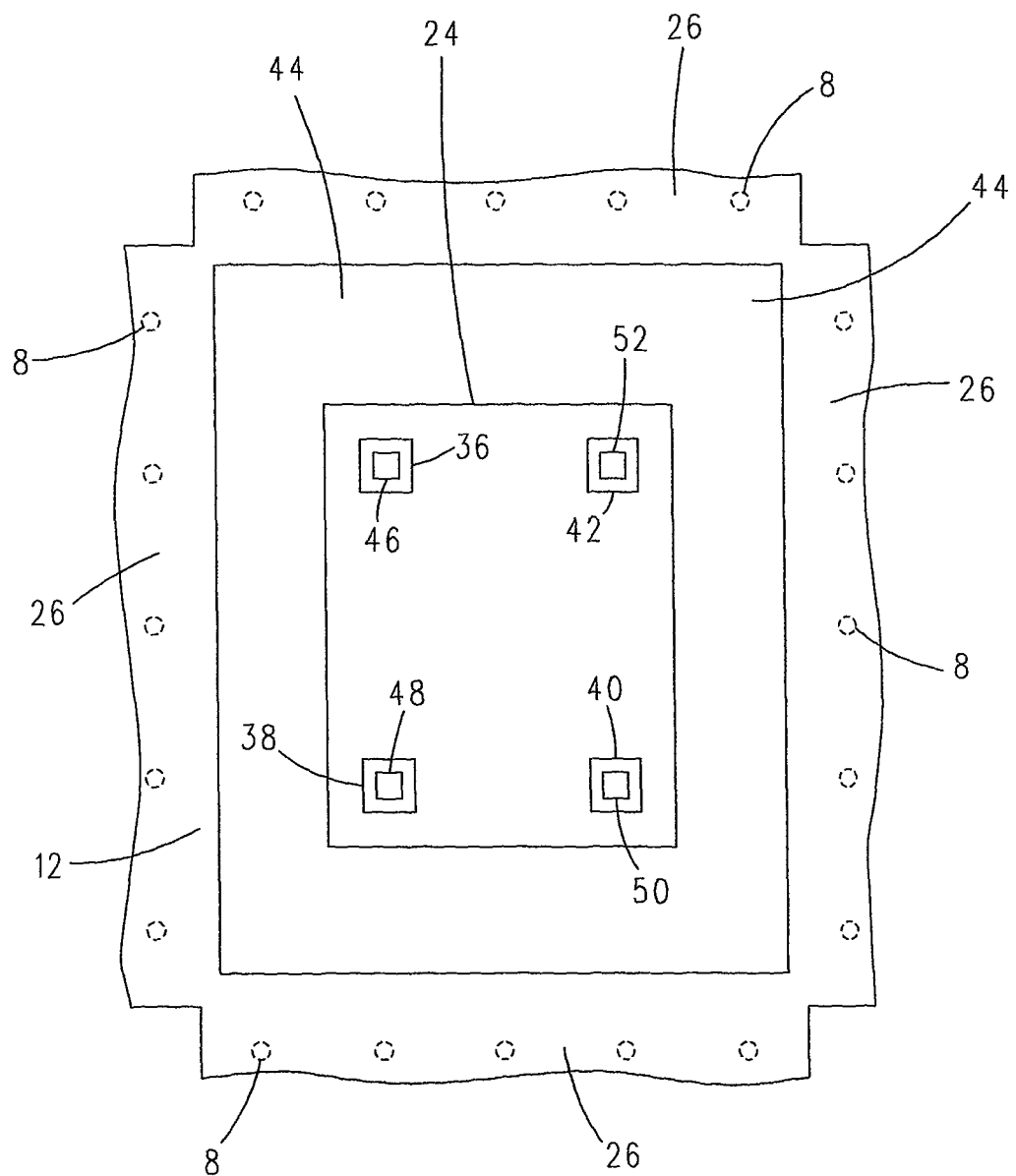
FIG. 14 is a plan view of the object atop of the shadow mask as shown in FIG. 13 after the tensioning process wherein alignment features of the object properly aligned with alignment features, such as one or more deposition apertures, of the shadow mask.

While the above example was described in connection with correcting or undoing a physical or geometrical distortion of the array of apertures 24 caused by initial tensioning of shadow mask 12 via adjustment of one or more of the tensioning screws 8, this is not to be construed as limiting the invention since it is envisioned that object 44 can be positioned over shadow mask 12 prior to adjustment of one or more of the tensioning screws 8 and/or any physical or geometrical distortion of shadow mask 12. For example, the array of apertures shown by the dashed line 24 in FIG. 13 and the first set of alignment features shown by dashed lines 36A-42A in FIG. 13 can have the undistorted physical or geometrical form shown in FIG. 13, whereupon when object 44 is positioned atop of shadow mask 12, the second set of alignment features 46-52 is positioned relative to the first set of alignment features shown by dashed lines 36A-42A in FIG. 13. Thereafter, tension can be applied to shadow mask 12 by adjusting one or more tensioning screws 8 in order to stretch shadow mask as necessary in order to align the first set of alignment features 36-42 with the second set of alignment features 46-52 as shown, for example, in FIG. 14.

In an example, the first and second sets of alignment features are shown as squares or rectangles. However, this is not to be construed as limiting the invention. For example, the first set of alignment features can be squares while the second set of alignment features can be circles, or vice versa. In this regard, it is envisioned that any suitable and/or desirable shape of the first set of alignment features and shape of the second set of alignment features can be utilized.

In an example, one or more of the first set of alignment features 36-42 of shadow mask 12 can be a deposition aperture of shadow mask 12. A benefit of using one or more deposition apertures of shadow mask 12 as an alignment feature is that it is not necessary for shadow mask 12 to have dedicated alignment features used only for the purpose of tensioning shadow mask 12 in the manner described above.

When the first set of alignment features 36-42 of shadow mask 12 is properly aligned with the second set of alignment features 46-52 of object 44, e.g., a transparent sheet, adhesive 32 (FIG. 9) can be applied to bond shadow mask 12 to shadow mask frame 10. At a suitable time prior to or after applying adhesive 32, object 44 can be removed from atop of shadow mask 12. Once shadow mask 12 has been bonded to shadow mask frame 10, edge taps 26 can be removed from shadow mask 12 in any suitable and/or desirable manner, e.g., cut along dash lines 34 (FIG. 7) with a utility knife, whereupon the combination of shadow mask frame 10 and shadow mask 12 can be separated from support plate 14, anchor frame 2, anchor bars 4, tensioning frame 6, etc.

As can be seen, the present invention is a shadow mask tensioning method. In an example, the method includes positioning a shadow mask frame 10 and the anchor frame 2 in spaced relation defining a gap 30 therebetween. A shadow mask 12 having at least one first alignment feature 36, 38, 40, or 42 is positioned on shadow mask frame 10 and anchor frame 2 with a portion of shadow mask 12 extending across gap 30. Shadow mask 12 is then affixed to anchor frame 2 by clamping the edges of shadow mask 12 to anchor frame 2, e.g., with anchor bars 4. Next, object 44 including at least one second alignment feature 46, 48, 50, or 52 is positioned on a side of shadow mask 12 opposite anchor frame 2 and shadow mask frame 10 with the second alignment feature not in final alignment with the first alignment feature. Thereafter, shadow mask 12 is tensioned by urging the portion of the shadow mask 12 into the gap 30 thereby bringing the first alignment feature into final alignment with the second alignment feature. Thereafter, the shadow mask 12 is affixed to shadow mask frame 10.

In an example, the method can include affixing multiple edges of the shadow mask 12 to the anchor frame 2. In an example, the method can further include separating shadow mask 12 affixed to shadow mask frame 10 from anchor frame 2. The step of separating the shadow mask affixed to the shadow mask frame from the anchor frame can include cutting the portion of the shadow mask that extends across the gap 30.

In an example, shadow mask 12 can include an edge tab 26. The portion of the shadow mask can be the edge tab. The step of affixing shadow mask 12 to anchor frame 2 can include affixing the edge tab 26 of shadow mask 12 to anchor frame 2. The step of separating the shadow mask 12 affixed to shadow mask frame 10 from anchor frame 2 can include separating the edge tab 26 from shadow mask 12 affixed to shadow mask frame 10.

In an example, the method can further include affixed to anchor frame 2 a tensioning frame 6 that supports a plurality of tension screws 8 in alignment with gap 30. The step of tensioning the shadow mask can include adjusting (rotating) the plurality of tensioning screws 8 in a manner to urge the portion of the shadow mask 12 into gap 30.

In an example, the object including the at least one second alignment feature can be utilized in combination with the shadow mask having the at least one first alignment feature before any tensioning of the shadow mask and/or physical and/or geometrical distortion of the shadow mask occurs. In another example, in response to physical distortion of one or more apertures of the array of apertures 24 of shadow mask 12 caused by adjusting one or more of the tensioning screws 8, a subset of the tensioning screws 8 can be adjusted to undo the physical and/or geometrical distortion. As can be understood from FIG. 9, the gap 30 and the portion of the shadow mask that extends across gap 30 can surround shadow mask frame 10.

In an example, object 44 can be a transparent sheet. However, this is not to be construed as limiting the invention since it is envisioned that any suitable and/or desirable object 44 that includes a second set of alignment features that can be aligned with the first set of alignment features of shadow mask 12 can be utilized. For example, the second set of alignment features can include a plurality of wires supported by a frame in a grid-like pattern or any other suitable and/or desirable object 44 that enables alignment between second alignment features of the object 44 and first alignment features of shadow mask 12.

In an example, object 44 can be supported such that shadow mask 12 can move independent of object 44. In an example, an alignment object support 54 can perform this function. In an example, the alignment object support 54 can support object 44 in spaced relation to shadow mask 12 with a gap 56 therebetween. However, provided shadow mask 12 can move and be tensioned without undue restriction, object 44 can be in contact with shadow mask 12 whereupon gap 56 is not present.

In an example, alignment object support 54 maintains object 44 in a fixed position relative to shadow mask 12 during tensioning of shadow mask 12. In this manner, the at least one second alignment feature of object 44 acts as fixed reference point(s) for the at least one first alignment feature of shadow mask 12.

In an example, at least one of the first alignment feature of shadow mask 12 can be a deposition aperture of shadow mask 12. In this regard, the deposition aperture can perform the dual function of a deposition aperture for the purpose of vapor depositing materials on a substrate and for an alignment feature the purpose of tensioning shadow mask 12 to shadow mask frame 10.

In another example, a shadow mask tensioning apparatus is disclosed that includes means for supporting a shadow mask 12 that includes one or more first alignment features 36-42, with a portion of the shadow mask 12 that surrounds the one or more first alignment features 36-42 in alignment with a gap 30. In an example, the means for supporting the shadow mask can include a shadow mask frame 10 and an anchor frame 2. The tensioning apparatus can also include means for anchoring the shadow mask. In an example, the means for anchoring the shadow mask can include an anchor bar 4 in combination with anchor frame 2.

An object can be provided that includes one or more second alignment features 46-52 configured to be positioned on a side of shadow mask 12. Finally, the apparatus includes means for urging the portion of shadow mask 12 that surrounds the one or more first alignment features 36-42 into gap 30 thereby bringing the one or more first alignment features 36-42 into alignment with the one or more second alignment features 46-52. In an example, the means for urging can include tensioning frame 6 and tensioning screws 8.

In an example, the means for supporting can include shadow mask frame 10 surrounded in spaced relation by the anchor frame 2 defining the gap 30 therebetween.

In an example, the means for anchoring can include anchor bar 4 in combination with the anchor frame 2 sandwiching an edge 26 of shadow mask 12 therebetween.

In an example, at least one of the first alignment features of the shadow mask 12 can be a deposition aperture of shadow mask 12.

In an example, the means for urging can include tensioning frame 6 supporting the tensioning screws 8 in alignment with the portion of shadow mask 12 that surrounds the one or more deposition apertures of the array of apertures 24. The tensioning screws 8 can be operative for urging the portion of the shadow mask 12 into the gap 30 in response to rotation of the tensioning screws 8.

In an example, the object 44 can be a transparent sheet. In another example, the apparatus can further include means for supporting object 44 such that shadow mask 12 can move independently of object 44.

Finally, in an example of a shadow mask tensioning method, an object 44 having a second set of alignment features 46, 48, 50, and/or 52 is arranged on a side of shadow mask 12 having a first set of alignment features 36, 38, 40, and/or 42 such that object 44 and shadow mask 12 can move independently of each other and the first and second sets of alignment features are not in final alignment. Tension can be applied to shadow mask 12 to bring the first set of alignment features into final alignment with the second set of alignment features. In an example, the first set of alignment features can comprise at least one deposition aperture of the shadow mask.

The present invention has been described with reference to exemplary embodiments. Obvious combinations and alterations will occur to others upon reading and understanding the preceding detailed description. For example, the illustration in FIGS. 4, 6 and 8 of hand tightening threaded bolts 16 and/or tensioning screws 8 is not to be construed as limiting the invention. It is intended that the invention be construed as including all such modifications and alterations insofar as they come within the scope of the appended claims or the equivalents thereof.

The invention claimed is:

1. A shadow mask tensioning method comprising:
   (a) positioning a shadow mask frame and an anchor frame in spaced relation defining a gap therebetween;
   (b) positioning a shadow mask having at least one first alignment feature on the shadow mask frame and the anchor frame with a portion of the shadow mask extending across the gap;
   (c) affixing the shadow mask to the anchor frame;
   (d) positioning an object including at least one second alignment feature on a side of the shadow mask opposite the anchor frame with the second alignment feature not in final alignment with the first alignment feature;
   (e) following steps (a)-(d), tensioning the shadow mask by urging the portion of the shadow mask into the gap thereby bringing the first alignment feature into alignment with the second alignment feature, wherein tensioning the shadow mask includes adjusting the tension at numerous, spaced locations of the portion of the shadow mask; and (f) following step (e), affixing the shadow mask to the shadow mask frame.

2. The method of claim 1, wherein step (c) includes affixing multiple edges of the shadow mask to the anchor frame.

3. The method of claim 1, further including:

(g) following step (1), separating the shadow mask affixed to the shadow mask frame from the anchor frame.

4. The method of claim 3, wherein step (g) includes cutting the portion of the shadow mask extending across the gap.

5. The method of claim 3, wherein:
the shadow mask includes an edge tab;
the portion of the shadow mask is the edge tab;
step (c) includes affixing the edge tab of the shadow mask to the anchor frame; and
step (g) includes separating the edge tab from the shadow mask affixed to the shadow mask frame.

6. The method of claim 1, wherein:
the method further includes affixing to the anchor frame a tensioning frame that supports a plurality of tensioning screws in alignment with the gap; and
adjusting the tension at numerous, spaced locations of the portion of the shadow mask in step (e) includes adjusting (rotating) each tensioning screw in a manner to urge the portion of the shadow mask into the gap.

7. The method of claim 6, wherein step (e) further includes, in response to physical distortion of one or more deposition apertures of the shadow mask caused by adjusting the plurality of tensioning screws, adjusting a subset of the plurality of tensioning screws to undo the physical distortion.

8. The method of claim 1, wherein the gap and the portion of the shadow mask surround the shadow mask frame.

9. The method of claim 1, wherein the object is a transparent sheet.

10. The method of claim 1, wherein step (d) includes supporting the object such that the shadow mask can move independent of the object.

11. The method of claim 1, wherein the at least one first alignment feature is a deposition aperture of the shadow mask.

12. A shadow mask tensioning apparatus comprising:
means for supporting a shadow mask that includes one or more first alignment features with a portion of the shadow mask that surrounds the one or more first alignment features in alignment with a gap;
means for anchoring the shadow mask;
an object including one or more second alignment features configured to be positioned on a side of the shadow mask; and
means for individually urging numerous, spaced locations of the portion of the shadow mask that surrounds the one or more first alignment features into the gap thereby bringing the one or more first alignment features into alignment with the one or more second alignment features.

13. The apparatus of claim 12, wherein the means for supporting includes a shadow mask frame surrounded in spaced relation by an anchor frame defining the gap between the shadow mask frame and the anchor frame.

14. The apparatus of claim 13, wherein the means for anchoring includes an anchor bar and the anchor frame sandwiching an edge of the shadow mask therebetween.

15. The apparatus of claim 12, wherein at least one of the first alignment features comprises a deposition aperture of the shadow mask.

16. The apparatus of claim 12, wherein the means for individually urging includes a tensioning frame supporting tensioning screws in alignment with the portion of the shadow mask that surrounds the one or more deposition apertures, the tensioning screws operative for urging the portion of the shadow mask into the gap in response to rotation of the tensioning screws.

17. The apparatus of claim 12, wherein the object is a transparent sheet.

18. The apparatus of claim 12, further including means for supporting the object such that the shadow mask can move independently of the object.

19. A shadow mask tensioning method comprising:

(a) arranging an object having a second set of alignment features on a side of shadow mask having a first set of alignment features such that the object and the shadow mask can move independently of each other and the first and second sets of alignment features are not in final alignment; and (b) applying tension to the shadow mask to bring the first set of alignment features into final alignment with the second set of alignment features, wherein applying tension to the shadow mask includes adjusting the tension at numerous, spaced locations of the shadow mask.

20. The method of claim 19, wherein the first set of alignment features comprise at least one deposition aperture of the shadow mask.

* * * * *

UNITED STATES PATENT AND TRADEMARK OFFICE
CERTIFICATE OF CORRECTION

| | | |
|---|---|---|
| PATENT NO. | : 9,581,917 B2 | Page 1 of 1 |
| APPLICATION NO. | : 14/748685 | |
| DATED | : February 28, 2017 | |
| INVENTOR(S) | : Brian Arthur Bucci | |

It is certified that error appears in the above-identified patent and that said Letters Patent is hereby corrected as shown below:

In the Claims

Column 11, Line 12, Claim 3, delete "(1)," and insert -- (f), --

Column 11, Line 29, Claim 6, delete "numberous," and insert -- numerous, --

Column 12, Line 45, Claim 19, delete "numberous," and insert -- numerous, --

Signed and Sealed this
Fourth Day of July, 2017

Joseph Matal
*Performing the Functions and Duties of the*
*Under Secretary of Commerce for Intellectual Property and*
*Director of the United States Patent and Trademark Office*